(12) United States Patent
Tanaka et al.

(10) Patent No.: US 7,282,770 B2
(45) Date of Patent: Oct. 16, 2007

(54) SEMICONDUCTOR DEVICE AND FABRICATION PROCESS THEREOF

(75) Inventors: Takuji Tanaka, Kawasaki (JP); Hiroshi Nomura, Kawasaki (JP); Yasunori Iriyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 11/180,786

(22) Filed: Jul. 14, 2005

(65) Prior Publication Data

US 2006/0220139 A1 Oct. 5, 2006

(30) Foreign Application Priority Data

Mar. 29, 2005 (JP) ............... 2005-096276

(51) Int. Cl.
*H01L 29/76* (2006.01)
*H01L 29/94* (2006.01)
*H01L 31/00* (2006.01)

(52) U.S. Cl. ...................... 257/371; 257/369
(58) Field of Classification Search ............... 257/369, 257/371, 372
See application file for complete search history.

(56) References Cited

U.S. PATENT DOCUMENTS

| 5,281,842 A * | 1/1994 | Yasuda et al. ............. 257/371 |
| 5,668,755 A * | 9/1997 | Hidaka ....................... 365/182 |
| 5,818,099 A | 10/1998 | Burghartz et al. |
| 6,091,113 A * | 7/2000 | Tanaka ....................... 257/355 |
| 6,194,776 B1 | 2/2001 | Amano et al. |
| 6,300,819 B1 | 10/2001 | De et al. |
| 7,060,566 B2 * | 6/2006 | Vogelsang .................. 438/270 |
| 2006/0151836 A1 * | 7/2006 | Salcedo et al. ............. 257/362 |

FOREIGN PATENT DOCUMENTS

| JP | 10-199993 | 7/1998 |
| JP | 10-199993 A | 10/1998 |

OTHER PUBLICATIONS

European Search Report dated Jun. 23, 2006.

* cited by examiner

*Primary Examiner*—Richard T. Elms
*Assistant Examiner*—Allison P. Bernstein
(74) *Attorney, Agent, or Firm*—Westerman, Hattori, Daniels & Adrian, LLP.

(57) ABSTRACT

A semiconductor device includes a semiconductor substrate of a first conductivity type, a well of the first conductivity type formed in the semiconductor substrate, a transistor formed in the well, a diffusion region of a second conductivity type formed in the semiconductor substrate so as to cover a lateral side and a bottom edge of the well, a terminal formed on the semiconductor substrate at an outside part of the diffusion region, and a conductive region contacting with the well, the well being in ohmic contact with the terminal via the conductive region and the semiconductor substrate, the conductive region having an impurity concentration level exceeding an impurity concentration level of the semiconductor substrate.

10 Claims, 7 Drawing Sheets

SEMICONDUCTOR DEVICE AND FABRICATION PROCESS THEREOF

CROSS-REFERENCE TO RELATED APPLICATION

The present application is based on Japanese priority application No. 2005-096276 filed on Mar. 29, 2005, the entire contents of which are hereby incorporated by reference.

BACKGROUND OF THE INVENTION

The present invention generally relates to semiconductor devices and fabrication process thereof and more particularly to a semiconductor device including a field effect transistor and fabrication process thereof.

With demand for improvement of performance in semiconductor devices in recent years, there is also a demand of improved performance in the field effect transistors (FET) such as a metal-oxide-semiconductor (MOS) transistor used in such semiconductor devices. Typically, a MOS transistor has a structure in which a source region and a drain regions are formed in a diffusion layer called well formed in a semiconductor substrate in the form of diffusion regions of opposite conductivity type.

In order to improve the resistance of such MOS transistors against noise, there is proposed the use of a so-called triple well structure in which a well used for a device region is formed in a substrate in a manner surrounded by an impurity diffusion region of opposite conductivity type. With such a structure, the well forming the device region is isolated from the influence of other circuits or the semiconductor substrate itself.

In this technology of triple well, it is proposed to provide a terminal outside the triple well and control the potential of the well inside the triple well via a conduction region formed so as to conduct the interior of the triple well with the external terminal (Patent Reference 1).

REFERENCE

Patent Reference 1 Japanese Laid-Open Patent Application 10-199993

SUMMARY OF THE INVENTION

Figure 1:
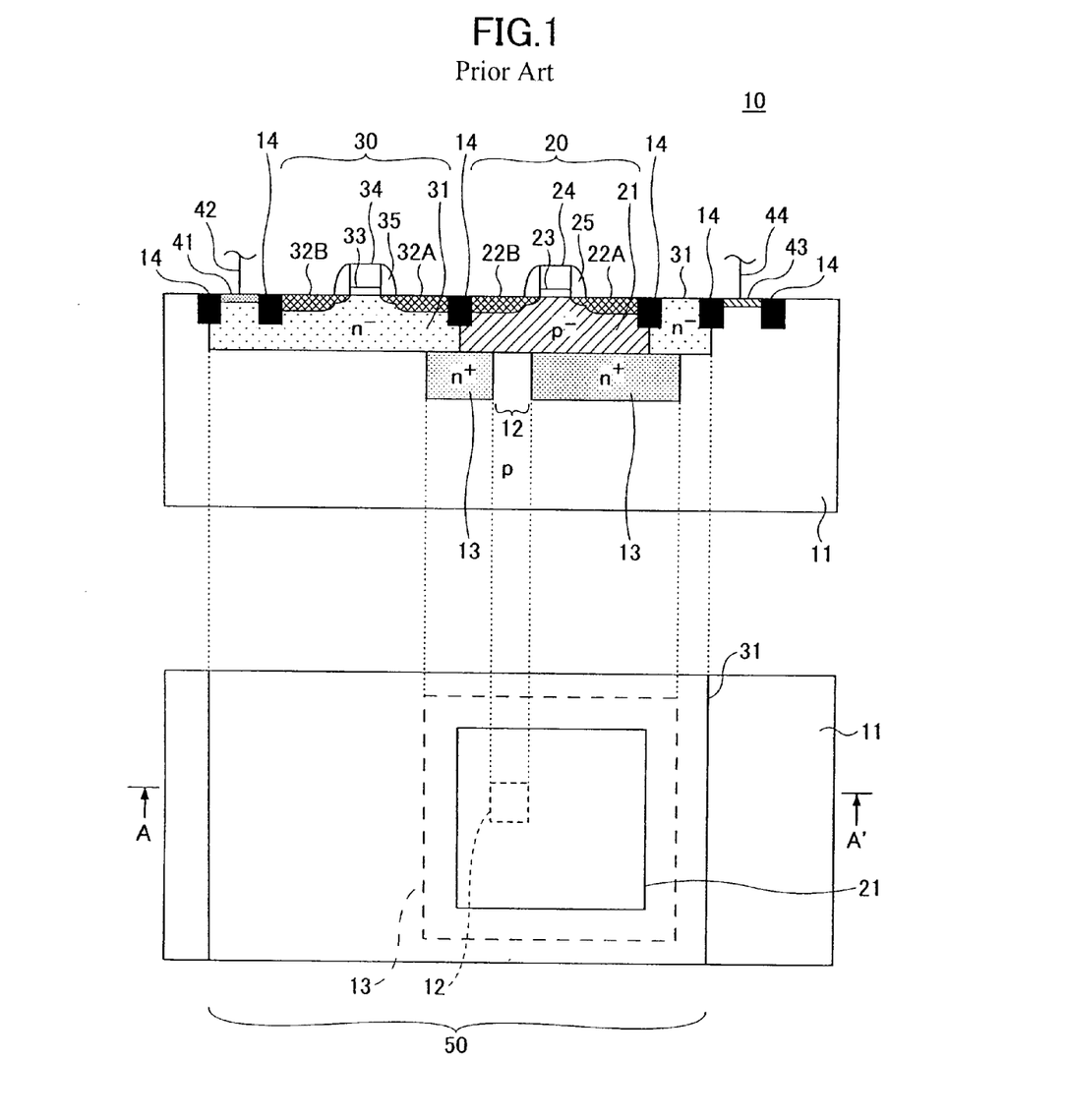
FIG. 1 is a diagram showing the construction of a conventional semiconductor device.

FIG. 1 is a diagram showing the construction of a conventional semiconductor device 10 that uses a MOS transistor 20, wherein the drawing shows the semiconductor device 10 in a plan view in the lower part thereof, while FIG. 1 shows a cross-sectional view of the semiconductor device 10 taken along an A-A' line of the plan view in the upper part thereof. In the plan view, it should be noted that some part of the structure shown in the cross-sectional view is omitted.

Referring to FIG. 1, the semiconductor device 10 has a construction in which there is formed a device region 21 of p-type in a silicon substrate 11 of p-type such that the device region 21 forms a p-type well defined by a device isolation region 14 of shallow trench isolation (STI) structure. Further, the semiconductor device 20, which may be an n-channel MOS transistor, is formed in the device region 21 thus formed on the substrate 11.

More specifically, the n-channel MOS transistor 20 includes a gate insulation film 23 formed on the p-type well 21 and a gate electrode 24 is formed on the gate insulation film 23 in correspondence to a channel region in the p-type well 21. Typically, the p-type well 21 has an impurity concentration level exceeding the impurity concentration level of the substrate 11.

Further, diffusion regions 22A and 22B of n-type are formed in p-type well 21 as source and drain regions of the n-channel MOS transistor 20 at respective lateral sides of the gate electrode 24, wherein the source and drain regions 22A and 22B are formed so as to oppose with each other in the p-type well 21 across the channel region formed right underneath the gate electrode 24. Thereby, the diffusion regions 22A and 22B are formed with a reduced depth and reduced impurity concentration level for those parts thereof covered with sidewall insulation films 25 formed on respective sidewall surfaces of the gate electrode 24 and with an increased depth and increased impurity concentration level in those parts not covered with the sidewall insulation films 25.

In order to improve the robustness of the transistor 20 against noise from the substrate 101, the semiconductor device 10 is constructed on a so-called triple well structure, and thus, the p-type well 21 constituting the device region of the n-channel MOS transistor 20 is surrounded laterally by a diffusion region 31 of $n^-$-type. With this, the substrate 11 is substantially divided into the p-type well 21 and remaining p-type region of the substrate 11 by the $n^-$-type diffusion region 31.

Further, there is formed a diffusion region 13 of $n^+$-type further underneath the p-type well 21 in contact with a bottom edge thereof and further a bottom edge of the $n^-$-type well diffusion region 31 laterally surrounding the p-type well 21. Thereby, the $n^+$-type diffusion region 13 forms, together with the diffusion region 31 of $n^-$-type, a semiconductor isolation structure 50 of n-type surrounding the p-type well 21 at the lateral edge and the bottom edge thereof.

Further, it should be noted that there is provided a terminal 44 in the part of the substrate 11 outside the p-type well 21 with the semiconductor device 10 such that the terminal 44 is connected to a p-type part of the substrate 11 via a contact layer 43 of $p^+$-type, wherein there is provided another terminal 42 in a part of the $n^-$-type diffusion region 31 via a contact layer 41 of $n^+$-type. It should be noted that the terminal 44 is used to control a potential of the well 21 from outside by applying a reverse bias voltage therebetween.

With such a construction, the semiconductor isolation structure 50 isolates the p-type well 21, and hence the transistor 20 formed thereon, from the remaining p-type region of the substrate 11, which may function as noise source.

In order to allow control of potential of the p-type well 21 from the terminal 44, there is formed an "opening" 12 in the semiconductor isolation structure 50 at the bottom part thereof, more specifically in the diffusion layer 13 of $n^+$-type, wherein the "opening" 12 is in fact a region of the p-type silicon substrate 11 not formed with the diffusion region 13 of $n^+$-type and thus has the impurity concentration level substantially identical with the impurity concentration level of the silicon substrate 11. Thereby, the potential of the p-type substrate 11 is controlled externally by applying a reverse bias to the terminals 42 and 44 as noted above, and the potential of the silicon substrate 11 thus controlled is transmitted to the p-type well 21 via the opening 12.

With the construction of FIG. 1, there is further provided a p-channel MOS transistor 30 in the diffusion region 31 of n-type, which constitutes a part of the semiconductor isolation structure 50, while using the diffusion region 31 as an n-type well.

In the transistor 30, it should be noted that there is formed a gate insulation film 33 on the diffusion region 31 used for the n-type well and a gate electrode 34 is formed on the gate insulation film 33 in correspondence to a channel region formed in the well 31. Further, diffusion regions 32A and 32B of p-type are formed in the n-type well 31 so as to oppose with each other across the channel region formed right underneath the gate electrode 34.

With such a construction, sidewall insulation films 35 are formed on the respective sidewall surface of the gate electrode 34, and the source and drain regions 32A and 32B are formed with a reduced depth and reduced impurity concentration level in those parts thereof covered with the sidewall insulation film 35 and with increased depth and increased impurity concentration level in those parts not covered with the insulation film 35.

On the other hand, with advanced semiconductor devices of these days, there is imposed a severe demand of device miniaturization in addition to the demand of reducing the electric power consumption, and associated with this, there have been caused various problems with the semiconductor devices constructed on a triple well structure.

From the viewpoint of reducing the electric power consumption, it is desirable to apply as large bias voltage as possible across the terminals 42 and 44, and thus it is desirable that the potentials of the p-type well 21 and the semiconductor isolation structure 50 are controllable over wide range from a zero bias state to large reverse bias state. On the other hand, from the viewpoint of miniaturization of the semiconductor device, the size of the opening 12 has to be reduced as much as possible.

Thus, in the case there is applied a large reverse bias voltage across the electrodes 42 and 44 with a semiconductor device in which the size of the opening 12 is reduced, extension of the depletion layer formed in the opening 12 at the p/n junction between the $p^-$-type semiconductor constituting the opening 12 and the $n^+$-type diffusion region 13 is no longer ignorable with regard to the size of the opening 12, and it becomes difficult to transmit the potential of the substrate 11 controlled by the electrode 44 to the p-type well 21 via the opening 12. Depending on the magnitude of the potential difference and the size of the opening 12, there is even a possibility that a complete pinch-off is caused at the opening 12.

Thus, with the semiconductor device having a transistor constructed on a triple-well structure, there have been cases in which it becomes difficult to achieve both device miniaturization and reduction of electric power consumption simultaneously.

Accordingly, it is a general object of the present invention to provide a novel and useful semiconductor device and fabrication process thereof wherein the foregoing problems are eliminated.

A more specific object of the present invention is to achieve device miniaturization and decrease of electric power consumption at the same time in a semiconductor device having a transistor of triple-well structure.

In a first aspect, the present invention provides a semiconductor device, comprising:

a semiconductor substrate of a first conductivity type;

a well of said first conductivity type formed in said semiconductor substrate;

a transistor formed in said well;

a diffusion region of a second conductivity type formed in said semiconductor substrate so as to cover a lateral side and a bottom edge of said well;

a terminal formed on said semiconductor substrate at an outside part of said diffusion region; and a conductive region contacting with said well, said well being in ohmic contact with said terminal via said conductive region and said semiconductor substrate, said conductive region having an impurity concentration level exceeding an impurity concentration level of said semiconductor substrate.

According to the present invention, it is possible to achieve miniaturization and reduction of electric power consumption simultaneously in a semiconductor device that includes a transistor of triple well structure.

According to a second aspect, the present invention provides a method of fabricating a semiconductor device comprising a semiconductor substrate of a first conductivity type, a well of said first conductivity type formed in said semiconductor substrate, a transistor formed in said well, a diffusion region of a second conductivity type formed in said semiconductor substrate so as to cover a sidewall surface and a bottom surface of said well, a terminal formed on said semiconductor substrate at an outside part of said diffusion region, and a conductive region contacting with said well, said well being in ohmic contact with said conductive region via said semiconductor substrate, said conductive region having an impurity concentration level exceeding an impurity concentration level of said semiconductor substrate, said method comprising the steps of:

forming a conductive region in said semiconductor substrate by introducing a first impurity element of a first conductivity type; and forming said diffusion region by introducing a second impurity element of second conductivity type into said semiconductor substrate.

According to the present invention, it becomes possible to achieve miniaturization of the device size and reduction of electric power consumption simultaneously in a semiconductor device having a transistor of triple well structure.

Other objects and further features of the present invention will become apparent from the following detailed description when read in conjunction with the attached drawings.

BRIEF DESCRIPTION OF THE DRAWINGS

FIGS. 8A-8G are diagrams showing the fabrication process of the semiconductor device of FIG. 7;

FIGS. 9A and 9B are diagrams showing the fabrication process of a semiconductor device according to a fifth embodiment of the present invention;

FIGS. 10A and 10B are diagrams showing the fabrication process of a semiconductor device according to a sixth embodiment of the present invention;

FIGS. 11A and 11B are diagrams showing the fabrication process of a semiconductor device according to a seventh embodiment of the present invention;

FIGS. 12A and 12B are diagrams showing the fabrication process of a semiconductor device according to an eighth embodiment of the present invention;

FIG. 13 is a diagram showing the construction of a test device used for investigating the effect of the present invention;

FIG. 14 is a diagram showing the electric characteristics of the test device of FIG. 13.

DETAILED DESCRIPTION OF THE INVENTION

[Summary]

With the present invention, it becomes possible to achieve the object of reduction of electric power consumption and device miniaturization at the same time in a transistor constructed on a triple well structure.

With the transistor constructed on a triple well structure, there is formed a semiconductor isolation region around the well on which the transistor is formed, wherein the semiconductor isolation region has a conductivity type opposite to the conductivity type of the well. Thereby, the well is isolated from noise coming from outside of the semiconductor isolation region. Further, such a semiconductor isolation region includes therein an opening for allowing control of potential of the well from outside.

In order to reduce the electric power consumption while achieving device miniaturization at the same time with such a semiconductor device constructed on a triple well structure, it is desirable to apply a large reverse bias voltage across the semiconductor isolation region and the well while decreasing the size of the opening at the same time. Thereby, there is a concern that the depletion region formed in the opening as a result of the reverse biasing may no longer be ignorable and that there may be caused a pinch-off phenomenon in such an opening as a result of such a large reverse biasing.

In view of the foregoing, the present invention forms a conductive region of first conductivity type in such an opening with high impurity concentration level higher than the impurity concentration level of the substrate.

With such a construction, extension of the depletion region in the opening is effectively suppressed, and it becomes possible to achieve reduction of electric power consumption and device miniaturization at the same time with the transistor constructed on such a triple well structure.

Hereinafter, the present invention will be explained with reference to embodiments.

FIRST EMBODIMENT

Figure 2:
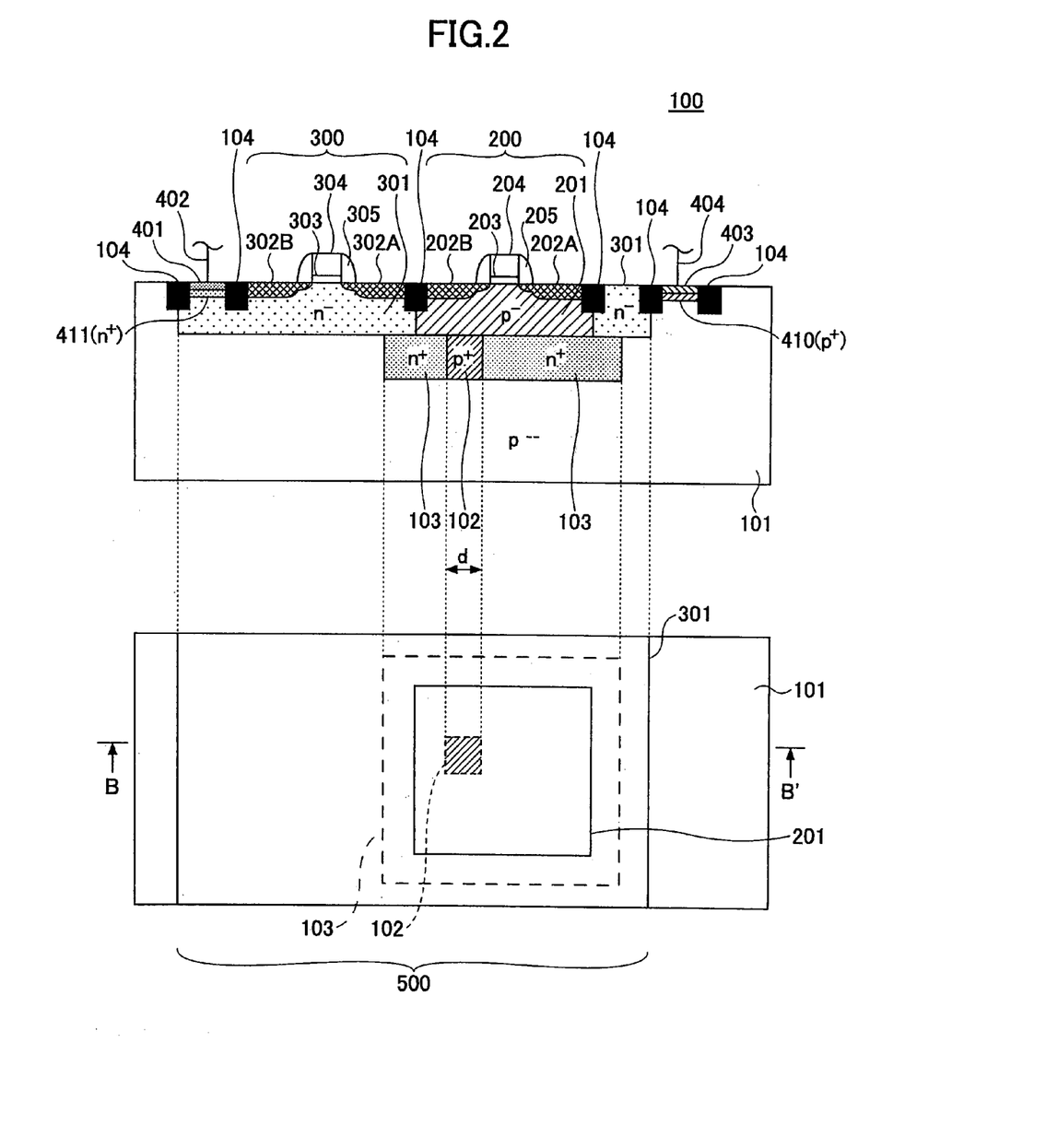
FIG. 2 is a diagram showing the construction of a semiconductor device according to a first embodiment of the present invention.

FIG. 2 is a diagram showing a part of a semiconductor device 100 including therein a MOS transistor 200 according to a first embodiment of the present invention, wherein FIG. 2 shows, in the bottom part of the drawing, the semiconductor device 100 of the present invention in a plan view, while the top part of FIG. 2 shows the same semiconductor device 100 in a cross-sectional view taken along a B-B' line of the plan view. In the plan view of FIG. 2, it should be noted that illustration is omitted for some part of the semiconductor device structure shown in the cross-sectional view.

Referring to FIG. 2, the semiconductor device 100 has a construction in which a device 200 such as an n-channel MOS transistor is formed in a device region defined on a substrate 101 of p-type (or a p-type well) by a device isolation region 104 of STI structure, wherein it should be noted that designation "P" provided to the substrate 101 in the drawing does not mean any specific impurity concentration level and it is possible to choose the impurity concentration level for the substrate 101 appropriately.

The n-channel MOS transistor 200 has a construction such that there is formed a p-type well 201 on the substrate 101 with an impurity concentration level higher than that of the substrate 101, and a gate insulation film 203 is formed on such a p-type well 201 in correspondence to a channel region to be formed therein. Further, a gate electrode 204 is formed on the gate insulation film 203, and source and drain regions 202A and 202B of n-type are formed in the p-type well 201 so as to oppose with each other across the channel region formed underneath the gate electrode 204.

Further, sidewall insulation films 205 are formed on respective sidewall surfaces of the gate electrode 204, and the source and drain regions 202A and 202B are formed with a shallow depth and smaller impurity concentration level in the part thereof covered by the sidewall insulation films 25 and with increased depth and larger impurity concentration level in the part thereof not covered by the sidewall insulation films 205.

The semiconductor device 100 uses a so-called triple well structure for eliminating noise from the substrate 101 to the transistor 200, wherein the triple well structure includes the p-type well 201 surrounded by a diffusion region 301 forming an n-type well. Thereby, the p-type substrate 101 is substantially divided into a part that includes therein the p-type well 201 and other p-type part not including the p-type well 201.

More specifically, in the structure of FIG. 2, there is further formed an n-type diffusion region forming the n-type well 301 in the silicon substrate 101 in the same plane of the p-type well 201 so as to surround the p-type well 201 laterally, and another n-type well 103 is formed underneath the p-type well 201 in contact with the bottom edge of the p-type well 201 and further the bottom edge of the surrounding n-type well 301, wherein the n-type diffusion region 103 has an impurity concentration level exceeding the impurity concentration level of the n-type well 301 and forms a semiconductor isolation structure 500 together with the n-type well 301 such that the semiconductor isolation structure 500 surrounds the p-type well 201 at the lateral edge and bottom edge thereof.

Thus, with formation of the semiconductor isolation structure 500, the p-type well 201 is isolated from other p-type region of the substrate 101, which may function as noise source.

Further, it should be noted that, in the outside region of the p-type well 201 isolated therefrom by the semiconductor isolation structure 500, there is formed a terminal 404 providing a potential to the p-type well 201, such that the terminal 404 is in ohmic contact with the p-type silicon constituting the p-type silicon substrate 101, via a highly-doped p-type contact layer 410 and a metallization layer 403 formed on the contact layer 410.

Similarly, there is provided a terminal 402 in a part of the diffusion region 301 of n⁻-type constituting the semiconductor isolation structure 500, wherein the terminal 402 makes an ohmic contact with the diffusion region 301 via a metallization 401 and a contact layer 411 of n⁺-type formed underneath the metallization 401.

Further, at the bottom part of the semiconductor isolation structure 500, more specifically, in a part of the n-type region 103, there is formed a conductive region 102 of p⁺-type so as to extend from the silicon substrate 101 to the p-type well 201, wherein the conductive region 102 transmits the potential provided to the substrate 101 from the terminal 404 to the p-type well 201.

Thus, by applying a reverse bias voltage across the terminals 402 and 404, the potential of the p-type silicon substrate 101 controlled by the bias voltage applied to the terminal 404 is transmitted to the p-type well 201 via the conductive region 102, wherein it should be noted that formation of depletion layer in the conductive region 102 at the p/n junction between the conductive region 102 of p⁺-type and the diffusion region 103 of n⁺-type is suppressed effectively because of the increased impurity concentration level in the conductive region 102. Thereby, it becomes possible to apply a large reverse bias voltage across the terminals 402 and 404 and a large potential difference can be induced between the p-type well 201 and the semiconductor isolation structure 500 while minimizing extension of the depletion layer.

Thus, with the present invention, it becomes possible to achieve device miniaturization and reduction of electric power consumption at the same time in the semiconductor device that uses a transistor formed on triple well structure.

For example, with the semiconductor device 100 of FIG. 2, it becomes possible to suppress the occurrence of pinch-off and reduce the electric power consumption even in such a case in which the width d of the conductive region 102 is set to 0.01-20 μm and a reverse bias voltage of 0-10V is applied between the conductive region 102 and the isolation region 103, by setting the impurity concentration level of the conductive region 102 to $3 \times 10^{15}$ cm⁻³ or more. Particularly, it is advantageous to suppress the occurrence of depletion layer when the difference of impurity concentration level between the substrate 101 and the conductive region 102 is equal to or larger than $3 \times 10^{15}$ cm⁻³.

In the construction of the present embodiment, it is also possible to form a p-channel MOS transistor 300 in the n-type diffusion region constituting a part of the isolation region 500. In this case, a part of the n-type diffusion region 301 is used as the n-type well on which the transistor 300 is formed.

More specifically, the MOS transistor is formed on the n-type well 301 formed in the substrate 101 and includes a gate insulation film 303 and a gate electrode 304 is formed on the gate insulation film 303. Further, source and drain regions 302A are formed in the n-type well 301 in the form of p-type diffusion region such that the source and drain regions 302A laterally define the channel region of the p-channel MOS transistor right underneath the gate electrode 304.

Thereby, the gate electrode 304 carries sidewall insulation films 305 on respective sidewall surfaces thereof, wherein the source and drain regions 302A and 302B are formed with a reduced depth and reduced impurity concentration level for the part covered by the sidewall insulation films 305 and with increased depth and increased impurity concentration level for the part not covered by the sidewall insulation films 305.

Figure 3:
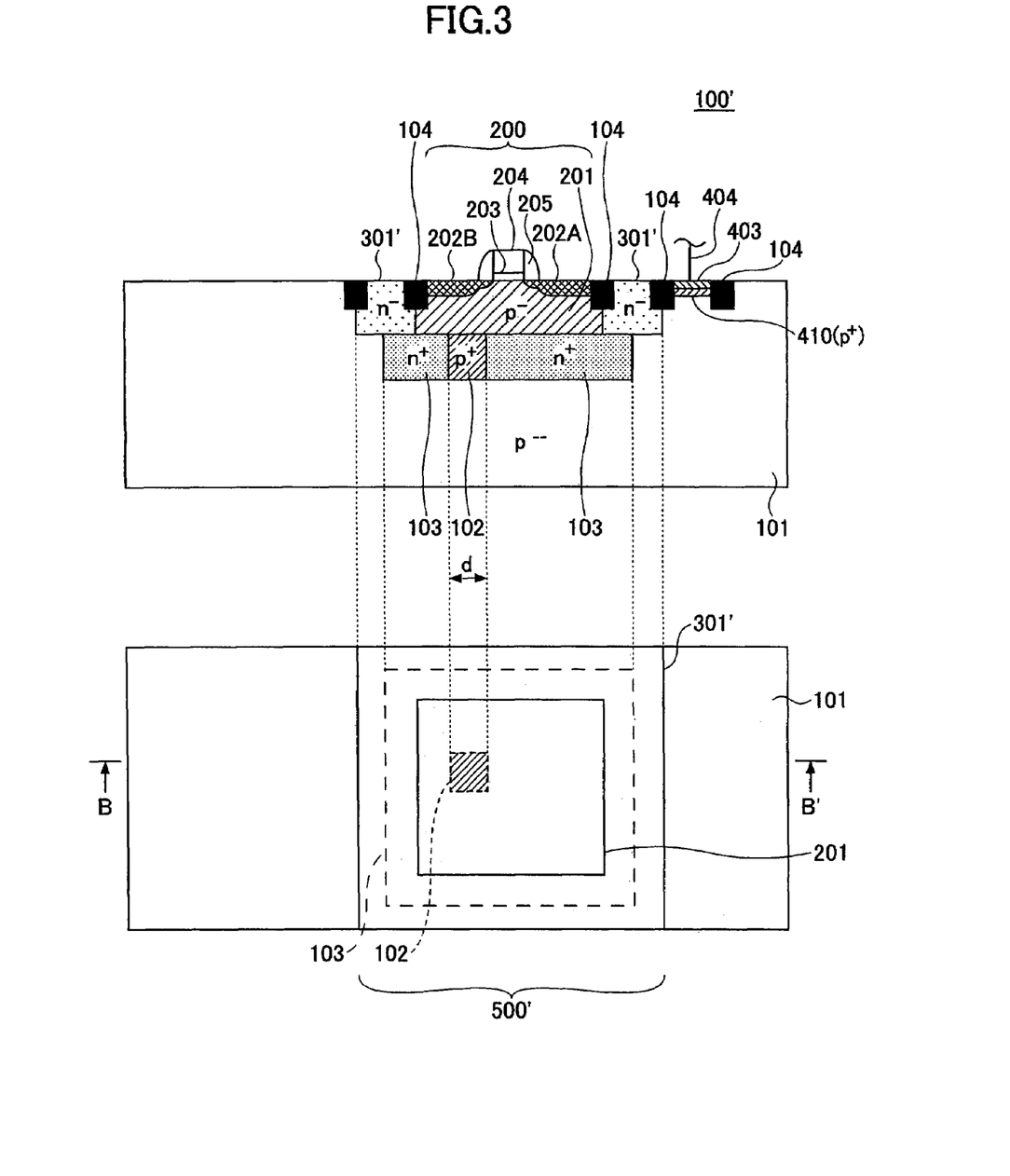
FIG. 3 is a diagram showing a modification of the semiconductor device of the first embodiment.

FIG. 3 shows the construction of a semiconductor device 100' according to a modification of the semiconductor device 100, wherein those parts corresponding to the parts described previously are designated by the same reference numerals and the description thereof will be omitted.

Referring to FIG. 3, it will be noted that no transistor is formed in a diffusion region 301' of n-type corresponding to the diffusion region 300 with the semiconductor device 100', wherein the diffusion region 301' functions as a part of a semiconductor isolation structure 500' corresponding to the semiconductor isolation structure 500 of FIG. 2. In this modification, it is possible to form a well for another transistor adjacent to the n-type diffusion region 301'.

SECOND EMBODIMENTS

Figure 4:
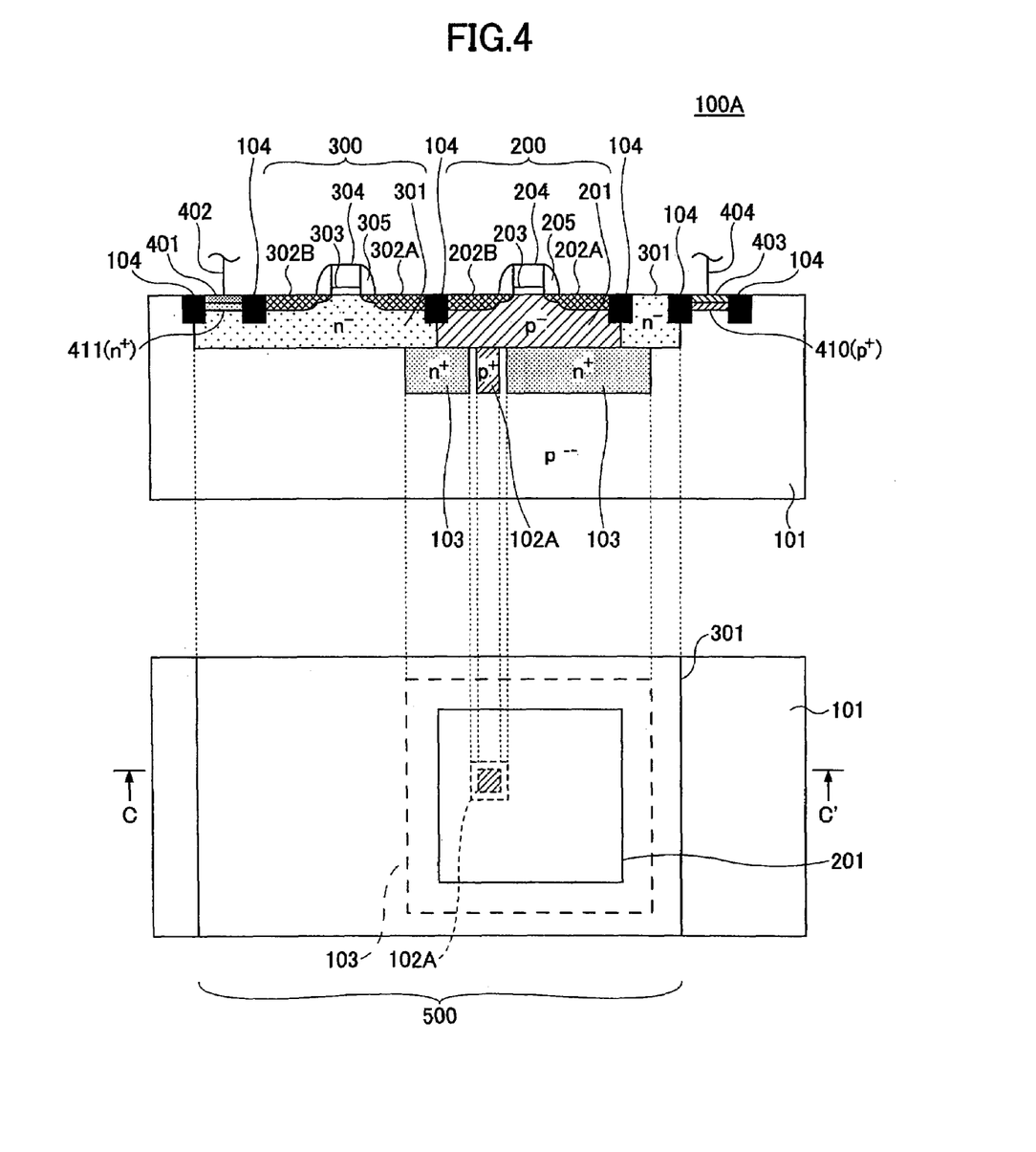
FIG. 4 is a diagram showing the construction of a semiconductor device according to a second embodiment of the present invention.

FIG. 4 is a diagram showing a part of a semiconductor device 10A including therein the MOS transistor 200 according to a second embodiment of the present invention, wherein FIG. 4 shows, in the bottom part of the drawing, the semiconductor device 100A of the present embodiment in a plan view, while the top part of FIG. 4 shows the same semiconductor device 100A in a cross-sectional view taken along a C-C' line of the plan view. In the plan view of FIG. 4, it should be noted that illustration is omitted for some part of the semiconductor device structure shown in the cross-sectional view. In FIG. 4, those parts corresponding to the parts described previously are designated by the same reference numerals and the description thereof will be omitted.

Referring to FIG. 4, the semiconductor device 100A forms a conductive region 102A in a part of the semiconductor isolation structure 500 in correspondence to the conductive region 102 of the previous embodiment except that the conductive region 102A has a reduced lateral size as compared with the conductive region 102 of the previous embodiment.

In the plan view, it will be noted that the area of the conductive region 102A is reduced as compared with the conductive region 102 of the previous embodiment in correspondence to the reduced lateral size thereof.

With the construction of the present embodiment, there is formed a p-type region of reduced impurity concentration level between the p⁺-type conductive region 102A and the diffusion region 103 of n⁺-type with an impurity concentration level lower than that of the conductive region 102A, such as the impurity concentration level of the silicon substrate 101.

With such a construction, it is possible to reduce the parasitic capacitance between the conductive region 102A and the diffusion region 103.

Thus, it should be noted that the size and shape of the conductive region 102A formed in the semiconductor isolation structure 500 can be changed variously according to the needs.

THIRD EMBODIMENT

Figure 5:
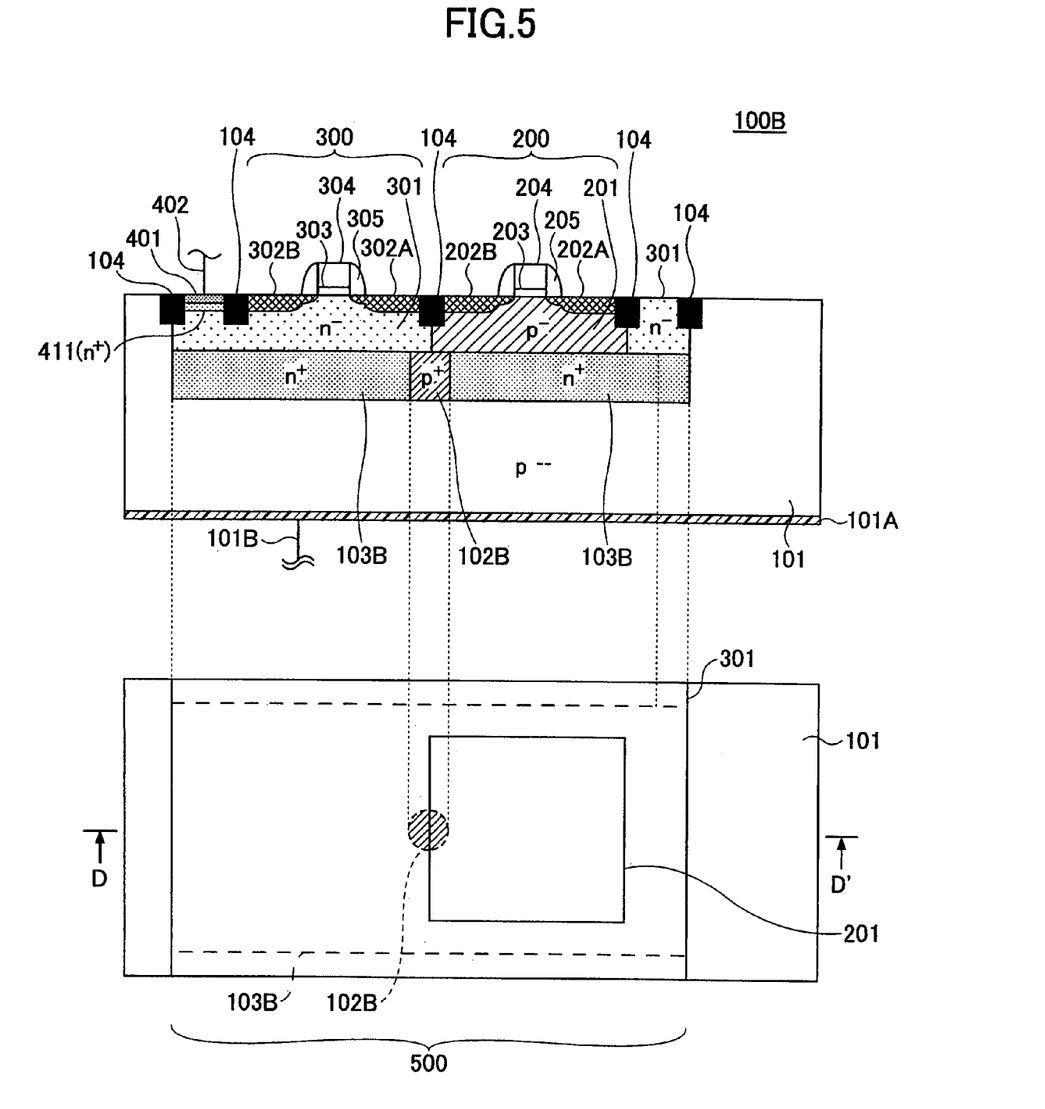
FIG. 5 is a diagram showing the construction of a semiconductor device according to a third embodiment of the present invention.

FIG. 5 is a diagram showing a part of a semiconductor device 100B including therein the MOS transistor 200 according to a third embodiment of the present invention, wherein FIG. 5 shows, in the bottom part of the drawing, the semiconductor device 100B of the present embodiment in a plan view, while the top part of FIG. 5 shows the same semiconductor device 100B in a cross-sectional view taken along a D-D' line of the plan view. In the plan view of FIG. 5, it should be noted that illustration is omitted for some part of the semiconductor device structure shown in the cross-sectional view. In FIG. 5, those parts corresponding to the parts described previously are designated by the same reference numerals and the description thereof will be omitted.

Referring to FIG. 5, it will be noted that there is formed a diffusion region 103B of n-type corresponding to the n-type diffusion region 103 of FIG. 2 such that the diffusion region 103B extends over a wide area of the substrate 101.

Further, the present embodiment uses a conductive region 102B of $p^{30}$-type in correspondence to the conductive region 102 of FIG. 2, wherein the conductive region 102B of the present embodiment is formed by introducing a p-type impurity element to a part of the $n^{30}$-type diffusion region 103B such that the concentration level of the p-type impurity element exceeds the concentration level of the n-type impurity element in the diffusion region 103B.

Here, it should be noted that the conductive region 102B is formed such that at least a part thereof makes a contact with the p-type well 201. In the present embodiment, for example, the conductive region 102B is formed in correspondence to a boundary of the p-type well 201 and the diffusion region 301 of $n^-$-type, and thus, it will be noted that the conductive region 102B makes a contact with both the p-type well 201 and the n-type diffusion region 301.

It should be noted further that the conductive region 102B has a circular cross-sectional shape contrary to the rectangular cross-sectional shape of the conductive region 102 used with the embodiment of FIG. 2, while such a difference in the shape does not influence the effect achieved with the present embodiment.

Thus, various shapes can be used for the conductive region 102B for transmitting the potential of the substrate 101 to the p-type well 201.

With the present embodiment, it should be noted that application of potential to the substrate 101 is achieved differently over the previous embodiments in that there is formed a contact layer 101A of highly doped p-type at the rear side of the substrate 101 and a terminal 101B is provided to the contact layer 101A thus formed for application of the potential. Thereby, the terminal 101B functions similarly to the terminal 404 of the previous embodiments. In this way, various embodiments are possible for the terminal 404 used for applying a potential to the p-type well 201.

Thus, with the semiconductor device of the present embodiment, it is possible to change the shape and location of the conductive region variously, and large degree of freedom is provided at the time of designing or making layout of the semiconductor device.

Figure 6:
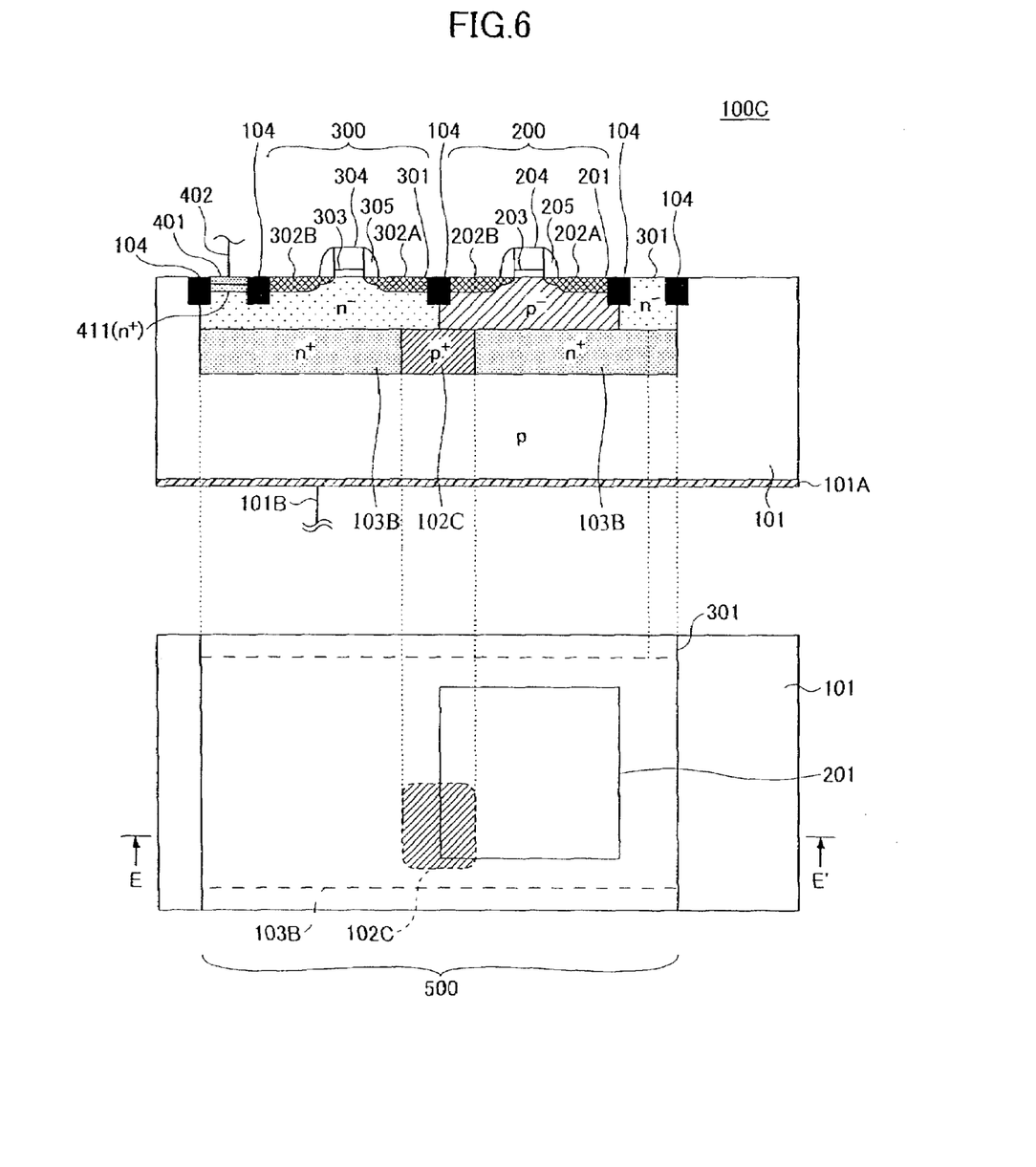
FIG. 6 is a diagram showing a modification of the semiconductor device of FIG. 5.

FIG. 6 is a diagram showing a semiconductor device 100C according to a modification of the semiconductor device 100B of the present embodiment, wherein those parts corresponding to the parts described previously are designated by the same reference numerals and the description thereof will be omitted.

Referring to FIG. 6, it will be noted that the conductive region 102C corresponding to the conductive region 102 of FIG. 2 is formed with an increased size with the semiconductor device 100C of FIG. 6. Further, with reference to the plan view, it will be noted that the conductive region 102C is provided at a location different from that of the conductive region 102. Further, it will be noted that the conductive region 102C is distinct over the conductive region 102 in that the conductive region 102C has a rounded rectangular shape when viewed in a plan view diagram. With such a construction, too, the conductive region 102C can function similarly to the conductive region 102.

Further, it should be noted that the n-type diffusion region 103B can be formed with various shapes and sizes with the present embodiment. For example, the diffusion region 103 may be formed over the entire substrate surface.

FOURTH EMBODIMENT

Figure 7:
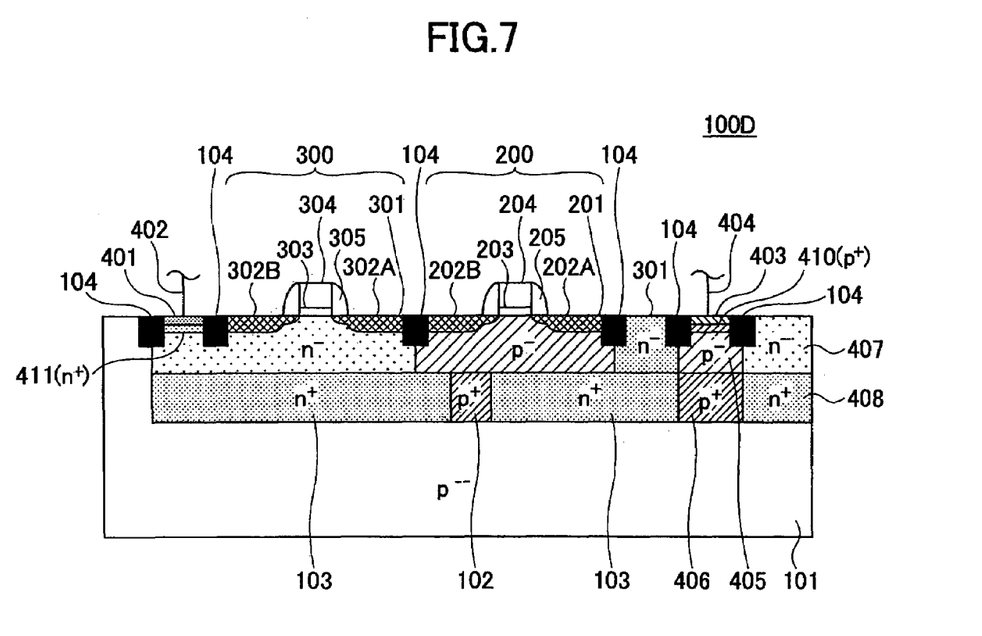
FIG. 7 is a diagram showing the construction of a semiconductor device according to a fourth embodiment of the present invention.

FIG. 7 is a diagram showing a part of a semiconductor device 100C including therein the MOS transistor 200 according to a fourth embodiment of the present invention, wherein those parts corresponding to the parts described previously are designated by the same reference numerals and the description thereof will be omitted.

Referring to FIG. 7, the diffusion region 103 of $n^+$-type is formed over a wide area with the semiconductor device 100D of the present embodiment as compared with the semiconductor device 100 explained with reference to FIG. 2, and thus, the diffusion region 103 extends over an area larger than the area of the diffusion region 103 of the device 100 of FIG. 2.

Further, the contact layer 410 is formed on a diffusion region 405 of p-type formed with the same fabrication process of the p-type well and thus have the impurity concentration level identical with the impurity concentration level of the p-type well 201, wherein the p-type diffusion region 405 is formed on a p-type diffusion region 406 having an impurity concentration level exceeding the impurity concentration level of the diffusion region 405. Thereby, the diffusion region 406 is formed with the same fabrication process of the conductive region 102, and thus, the impurity diffusion region 406 and the conductive region have the same impurity concentration level.

Further, in the outer side of the p-type diffusion region 405 and hence in the p-type diffusion region 406, there are formed diffusion regions 407 and 408 of n-type respectively at a side away from the MOS transistor 200, wherein the diffusion regions 407 and 408 are formed so as to isolate the p-type diffusion regions 405 and 406, respectively.

Thereby, it should be noted that the n-type diffusion region 407 is formed in the same fabrication process of the n-type diffusion region 301, and the n-type diffusion region 408 is formed in the same fabrication process of the n-type diffusion region 103.

Next, fabrication process of the semiconductor device 100D will be explained with reference to FIGS. 8A-8H, wherein those parts corresponding to the parts described previously are designated by the same reference numerals and the description thereof will be omitted.

First, in the step of FIG. 8A, formation of the device isolation structure 104 of STI structure is conducted on the silicon substrate 101 of p-type, and ion implantation process of a p-type impurity element is conducted in the step of FIG. 8B into the substrate 101 while using a resist pattern 501 formed on the silicon substrate 101 as a mask. Thereby, the conductive region 102 and the p-type diffusion region 406 are formed simultaneously in the form of highly doped p-type diffusion region.

Next, in the step of FIG. 8C, the resist pattern 501 is removed, and a resist pattern 502 is formed on the substrate 102 so as to cover the region where the conductive region 102 and the p-type diffusion region 406 are formed. Further, an ion implantation process of an n-type element is conducted into the silicon substrate 101 not covered with the resist pattern 502, and there are formed highly doped n-type diffusion regions as the n-type diffusion regions 103 and 408. Thus, with the process of the present embodiment, the conductive region 102 and the p-type diffusion region 406 are formed with the same impurity concentration level, and the n-type diffusion region 103 and the n-type diffusion region 408 are formed with the same impurity concentration level.

Further, the conductive region 102, the p-type diffusion region 406, the n-type diffusion region 103 and the n-type diffusion region 408 are formed substantially on the same plane.

Next, in the step of FIG. 8D, a resist pattern 503 is formed on the substrate 101 and ion implantation of a p-type impurity element is conducted, and with this, the p-type well 201 and the p-type diffusion region 405 of $p^-$-type are formed in the silicon substrate 101 in correspondence to the opening of the resist pattern 503, wherein the $p^-$-type well 201 and the $p^-$-type diffusion region 405 thus formed have an impurity concentration level higher than that of the silicon substrate 101, while the impurity concentration level of the $p^-$-type well 201 and the $p^-$-type diffusion regions 405 is lower than that of the $p^+$-type conductive region 102 and the $p^+$-type diffusion region 406.

Next, in the step of FIG. 8E, the resist pattern 503 is removed, and a new resist pattern 504 is formed on the silicon substrate 101 so as to cover the p-type well and the p-type diffusion region 405. Further, by conducting an ion implantation process of an n-type impurity element in this state, the diffusion regions 301 and 407 of $n^-$-type are formed in correspondence to the part of the silicon substrate 101 not covered with the resist pattern 504. Thus, the n-type diffusion regions 301 and 407 have a lower impurity concentration level as compared with the n-type diffusion regions 103 and 408.

Further, because of the foregoing process of fabrication, the p-type well 201 and the p-type diffusion region 405 have the same impurity concentration level, and n-type diffusion region 301 and the n-type diffusion region 407 have the same impurity concentration level. It should be noted that the p-type well 201, the p-type diffusion region 405, the n-type diffusion region 301 and the n-type diffusion region 407 are formed a substantially in the same plane in the silicon substrate 101.

Next, in the step of FIG. 8F, the resist pattern 504 is removed, and a gate insulation film is formed on the p-type well 201 and further on the n-type diffusion region 301. Further, by depositing and patterning a polysilicon layer on the gate insulation film thus formed, the gate electrode 204 is formed on the p-type well 201 via the gate insulation film 203 and the gate electrode 304 is formed on the n-type well 301 via the gate insulation film 303.

Next, in the step of FIG. 8F, a resist pattern 505 is formed on the silicon substrate 101 with resist openings corresponding to the p-type well 201 and the n-type diffusion region 411, and ion implantation process of an n-type impurity element is conducted into the substrate 101 while using the resist pattern 505 as a mask. With this, the source and drain regions 202A and 202B are formed in the p-type well 201 and an $n^+$-type diffusion region is formed as the contact layer 411.

Next, in the step of FIG. 8G, the resist pattern 505 is removed and a new resist pattern 506 is formed on the silicon substrate such that the resist pattern 506 forms resist openings in correspondence to the n-type well to be formed in the n-type diffusion region 301 as the device region of the p-channel MOS transistor 300 and the p-type diffusion region 410. Further, by conducting an ion implantation process of a p-type impurity element while using the resist pattern 506 as a mask, the source and drain regions 302A of $p^+$-type are formed in the n-type well 301 and the $p^+$-type contact region 410 is formed on the p-type region 405.

Next, the resist pattern 506 is removed, and the sidewall insulation films 205 and 305 are formed on the respective sidewall surfaces of the gate electrodes 204 and 304.

Further, formation of resist pattern and ion implantation of the impurity element are conducted similarly to the steps of FIGS. 8F-8G, and with this, the source and drain regions 202A and 202B are formed with reduced depth in the part closer to the gate electrode 204 and covered with the sidewall insulation films 205 and increased depth in the part far from the gate electrode 304 and not covered with the sidewall insulation films 205. Similarly, the source and drain regions 302A and 302B are formed with reduced depth in the part closer to the gate electrode 304 and covered with the sidewall insulation films 305 and increased depth in the part far from the gate electrode 304 and not covered with the sidewall insulation films 305.

Further, the metallization layers 401 and 403 are formed, and with formation of the terminals 402 and 404, the semiconductor device 100D shown in FIG. 7 is obtained.

After formation of the structure of FIG. 7, an interlayer insulation film is formed according to the needs, and a multilayer interconnection structure is formed on the transistors thus formed.

FIFTH EMBODIMENT

While the previous embodiment has formed the n-type diffusion region 103 after formation of the conductive region 102, the present invention is by no means limited to such a process and it is possible to form the conductive region 102 after formation of the n-type diffusion region 103.

In such a process, the steps of FIGS. 8B-8C of the previous embodiment are replaced with the steps 9A and 9B explained below. In the drawings, those parts corresponding to the parts explained previously are designated by the same reference numerals and the description thereof will be omitted. Further, in the drawings explained below, only those parts related to the conductive region 102 and the n-type diffusion region 103 will be represented and some parts of the structure shown in FIGS. 8A-8G will be omitted.

Referring to FIG. 9A, a resist pattern 502A is formed on the silicon substrate 101, and the n-type diffusion region 103 is formed in the silicon substrate 101 by conducting an ion implantation process of an n-type impurity element into the substrate 101 while using the resist pattern 502 as a mask.

Next, the resist pattern 502A is removed, and a resist pattern 501A is formed on the substrate 101 so as to cover a part thereof corresponding to the diffusion region 103. Thereby, the conductive region 102 of highly doped p-type region is formed in the part not covered with the resist pattern 501A by conducting an ion implantation process of a p-type impurity element.

Thus, with the present embodiment, it is possible to reverse the order of formation of the conductive region 102 of $p^+$-type and the semiconductor isolation structure formed of the diffusion regions 301 and 103 of n– or $n^+$-type.

SIXTH EMBODIMENT

Further, it should be noted that the resist pattern 501 shown in FIG. 8B and the resist pattern 502 shown in FIG. 8C are in a reversal relationship in that the part covering the substrate and the part forming a resist opening are reversed from each other. In the case of forming such resist patterns in reversal relationship, it is possible to use the same mask pattern and forming the respective resist patterns by using a positive resist and a negative resist as represented in FIGS. 10A and 10B. In FIGS. 10A and 10B, those parts corresponding to the parts explained before with reference to the fourth embodiment are designated by the same reference numerals and the description thereof will be omitted.

In the description below, only those parts related to formation of the conductive region 102 and the n-type diffusion region 103 are represented and the remaining parts of the structure shown in FIGS. 8A-8G are omitted.

FIG. 10A shows an example of formation of the resist pattern 501 shown in FIG. 8B.

In the step of FIG. 10A, a mask pattern M1 exposing a part corresponding to the resist opening of the resist pattern 501 is used for exposing a positive resist film 501a, and thus, the resist pattern 501 shown in FIG. 8B is obtained after development of the resist film 501a thus exposed.

FIG. 10B on the other hand shows an example of formation of the resist pattern 502 shown in FIG. 8C.

With the step of FIG. 10B, a mask pattern M1 exposing a part of the resist pattern 502 covering the substrate is used for exposing a negative resist film 502a, and the resist pattern shown in FIG. 8C is obtained after development of the resist film 502a thus exposed.

Thus, by using a negative resist and a positive resist appropriately, it is possible to use the same mask patter for the formation of the conductive region 102 and formation of the n-type diffusion region 103 forming a part of the semiconductor isolation structure 500.

Further, it is possible to change the order of the step of FIG. 10A and the step of FIG. 10B.

SEVENTH EMBODIMENT

FIGS. 11A and 11B are diagrams showing the fabrication process of a semiconductor device according to a seventh embodiment of the present invention, wherein those parts corresponding to he parts described previously with preceding embodiments are designated by the same reference numerals and the description thereof will be omitted.

Referring to FIG. 11A, an n-type impurity element is introduced into the part of the silicon substrate 101 by an ion implantation process to form an n$^+$-type diffusion layer 103B' of high impurity concentration level in the part where the n-type diffusion region 103B is to be formed including the region of the conductive region 102.

Next, in the step of FIG. 11B, a resist pattern 507 is formed on the silicon substrate 101 so as to cover the part thereof in which the n-type diffusion region 103B is to be formed, and ion implantation process of a p-type impurity element is conducted. Thereby, the conductive region 102B of p$^+$-type is formed in the part not covered with the resist pattern 507, while remaining region of the n$^+$-type diffusion region 103B' forms the diffusion region 103. In this case, it is necessary to conduction implantation of the p-type impurity element such that the concentration level of the p-type impurity element in the conductive region 102B exceeds the concentration level of the n-type impurity element in the diffusion region 103B of n$^+$-type.

EIGHTH EMBODIMENT

FIGS. 12A and 12B are diagrams showing the fabrication process of a semiconductor device according to an eighth embodiment of the present invention, wherein those parts corresponding to the parts described previously are designated by the same reference numerals and the description thereof will be omitted.

Referring to FIG. 12A, there is formed a diffusion region 102B' of p$^+$-type by introducing a p-type impurity element into the silicon substrate 101 with high concentration level including the region in which the conductive region 102B is to be formed, and in the step of FIG. 12B, there is conducted an ion implantation process of an n-type impurity element into the silicon substrate 101 while covering the part of the silicon substrate 101 corresponding to the conducive region 102B by providing a resist pattern 508.

As are result, the diffusion region 103B of n$^+$-type is formed in the part not covered with the resist pattern 508, while the part of the p$^+$-type diffusion region 102B' not formed with the diffusion region 103B of n$^+$-type forms the conductive region 102B of p$^+$-type. Thereby, it is necessary to conduct the ion implantation of the n-type impurity element such that the concentration level of the n-type impurity element in the diffusion region 103B exceeds the concentration level of the p-type impurity element therein.

NINTH EMBODIMENT

Next, the effect of suppressing the pinch-off achieved with the semiconductor device of the present invention will be described as a ninth embodiment of the present invention.

FIG. 13 shows the construction of a semiconductor device used for investigating the effect of the present invention.

Referring to FIG. 13, the semiconductor device has a structure similar to that of the semiconductor device 100 explained with reference to FIG. 2 except that source and drain regions, gate insulation film and gate electrode are eliminated.

More specifically, the semiconductor device of FIG. 13 is constructed on a silicon substrate 901 of p-type and includes therein a well 904 of p$^-$-type defined by a device isolation region 906 of STI structure and surrounded laterally by a diffusion region 905 of n$^-$-type, wherein there is provided a diffusion region of n$^+$-type underneath the p-type well 904 and the surrounding diffusion region 905 of n$^-$-type.

By using the device of FIG. 13, the electric characteristics thereof was investigated while setting the substrate 901 to a reference potential (0V).

First, the potential of the p-type well is fixed at 0.5V, and the current Ip flowing to the well 904 is investigated while changing the voltage Vn of the n-type diffusion region 903.

FIG. 14 shows the result of this investigation, wherein it will be noted that the experiment have been conductive for different impurity concentration levels for the conductive region 902 as represented by experiments EX1, EX2 and EX3.

More specifically, Experiment EX1 uses the same impurity concentration level of the substrate 901 for the conductive region 902, and thus, this experiment corresponds to the semiconductor device of conventional art.

In the case of experiment EX2, on the other hand, the impurity concentration level of the conductive region 902 is increased over the impurity concentration level of the substrate 901, while in the case of experiment EX3, the impurity concentration level of the conductive region 902 is increased further as compared with the case of experiment EX2.

Referring to FIG. 14, it will be noted that there occurs a sharp decrease of the current Ip flowing to the p-type well 904 with increase of the voltage Vn applied to the n-type diffusion region 903, indicating that there is taking place the phenomenon of pinch-off in the conductive region 902 because of extension of the depletion region from the p/n junction between the conductive region 902 and the n-type diffusion region 903. Particularly, in the case of the voltage Vn of about 1V, it will be noted that no substantial current flows anymore to the p-type well 904.

On the other hand, in the case of the experiments EX2 and EX3, there is caused substantial increase of the current Ip for the same voltage Vn as compared with the experiment EX1, indicating that formation of the depletion layer and subsequent occurrence of pinch-off are successfully suppressed. Further, with the case of experiment Ex3, the degree of drop of the current Ip is reduced as compared with the case of experiment EX2 for the same increase of the voltage Vn, while this clearly indicates that extension of the depletion region in the conductive region 902 is suppressed effectively by increasing the impurity concentration level of the conducive region 902.

Further, while explanation has been made heretofore with regard to the case of using a p-type substrate, it is also possible to use the present invention for a semiconductor device constructed on an n-type substrate by reversing the conductivity type of the respective regions.

Further, the present invention is not limited to the embodiments described heretofore, but various variations and modifications may be made without departing from the scope of the invention.

What is claimed is:

1. A semiconductor device, comprising:
a semiconductor substrate of a first conductivity type;
a well of said first conductivity type formed in said semiconductor substrate;
a transistor formed in said well;
a diffusion region of a second conductivity type formed in said semiconductor substrate so as to cover a lateral side and a bottom edge of said well;
a terminal formed on said semiconductor substrate at an outside part of said diffusion region; and
a conductive region contacting with said well,
said well being in ohmic contact with said terminal via said conductive region and said semiconductor substrate,
said conductive region having an impurity concentration level exceeding an impurity concentration level of said semiconductor substrate,
said conductive region extending through said diffusion region.

2. The semiconductor device as claimed in claim 1, wherein said well has an impurity concentration level exceeding an impurity concentration level of said semiconductor substrate.

3. The semiconductor device as claimed in claim 1, wherein said conductive region is formed in contact with said diffusion region.

4. The semiconductor device as claimed in claim 1, wherein there is provided another diffusion region between said conductive region and said diffusion region, said another diffusion region having an impurity concentration level lower than an impurity concentration level of said conductive region.

5. The semiconductor device as claimed in claim 1, further comprising: another well of said second conductivity type formed in said semiconductor substrate adjacent with said well of said first conductivity type; and another transistor formed in said another well.

6. The semiconductor device as claimed in claim 5, wherein said another well is formed in a part of said diffusion region.

7. The semiconductor device as claimed in claim 5, wherein said conductive region is formed in contact further with said another well.

8. The semiconductor device as claimed in claim 1, wherein said conductive region includes a first impurity element of said first conductivity type and a second impurity element of said second conductivity type, said first impurity element having a concentration level exceeding a concentration level of said second impurity element.

9. The semiconductor device as claimed in claim 1, wherein said conductive region has a width in the range of 0.01 µm to 20 µm and has an impurity concentration level of $3 \times 10^{15}$ cm$^{-3}$ or more.

10. The semiconductor device as claimed in claim 1, wherein there is a difference of $5 \times 10^{15}$ cm$^{-3}$ or more between said impurity concentration level of said conductive region and said impurity concentration level of said semiconductor substrate.

* * * * *